(12) United States Patent
Denpoh

(10) Patent No.: US 6,828,243 B2
(45) Date of Patent: Dec. 7, 2004

(54) APPARATUS AND METHOD FOR PLASMA TREATMENT

(75) Inventor: Kazuki Denpoh, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/294,838

(22) Filed: Nov. 15, 2002

(65) Prior Publication Data
US 2003/0062128 A1 Apr. 3, 2003

Related U.S. Application Data

(62) Division of application No. 09/782,519, filed on Feb. 14, 2001, now Pat. No. 6,514,347.

(30) Foreign Application Priority Data

Feb. 14, 2000  (JP) ......................................... P2000-35735

(51) Int. Cl.[7] ............................................. H01L 21/302
(52) U.S. Cl. ....................... 438/706; 438/710; 438/712; 156/345.14; 156/345.52
(58) Field of Search ................................ 438/706, 710, 438/712, 720; 156/345.14, 345.35, 345.52, 345.53, 345.27; 216/58; 118/724, 728

(56) References Cited

U.S. PATENT DOCUMENTS

| 5,919,332 | A | | 7/1999 | Koshiishi et al. |
| 5,958,265 | A | * | 9/1999 | Ogahara ................. 219/121.43 |
| 6,207,006 | B1 | | 3/2001 | Katoh |
| 6,265,031 | B1 | | 7/2001 | Ishii et al. |
| 6,373,679 | B1 | * | 4/2002 | Qiao et al. ................... 361/230 |
| 6,464,794 | B1 | * | 10/2002 | Park et al. ................... 118/728 |

FOREIGN PATENT DOCUMENTS

JP      7-310187      11/1995

* cited by examiner

Primary Examiner—Lan Vinh
(74) Attorney, Agent, or Firm—Pillsbury Winthrop LLP

(57) ABSTRACT

A compensation ring 31 disposed to surround a periphery of a wafer W on a susceptor 30 is concentrically divided into an inside first compensation ring member 32 and an outside second compensation ring member 33. A width of a first compensation ring member 32 is made such thin as one to three times mean free path of treatment gas molecules, thereby suppressing heat transfer between a susceptor 30 and a second compensation ring member 33. A base of a second compensation ring member, through a layer of conductive silicone rubber 34, is made to come into an intimate contact with an upper surface of a susceptor 30, thus helping to cool.

8 Claims, 11 Drawing Sheets

APPARATUS AND METHOD FOR PLASMA TREATMENT

This is a divisional application of Ser. No. 09/782,519, which was filed on Feb. 14, 2001, now U.S. Pat. No. 6,514,347 and whose contents are incorporated herein in their entire.

BACKGROUND OF THE INVENTION

1. Field of the Invention

The present invention relates to apparatus and a method for plasma treatment of a substrate to treat such as a semiconductor wafer or the like, more specifically relates to apparatus and a method for plasma treatment of a substrate to treat by the use of plasma.

2. Description of the Related Art

So far, in apparatus for treatment of a substrate to treat such as a semiconductor wafer or the like, for instance in apparatus for plasma treatment such as plasma-etching apparatus, it is usual to dispose an annular compensation ring on a susceptor thereon the wafer W is disposed. The compensation ring is a ring that is disposed in the surroundings of the wafer to compensate characteristics of plasma generated in a treatment chamber. For instance, by means of impedance of the ring, an electric field is concentrated on the wafer to help plasma distribute intensively on the wafer. Thereby, the plasma operates intensively on the wafer disposed on the susceptor.

FIG. 14 is a vertical sectional view showing schematically the inside of the treatment chamber of typical apparatus for plasma treatment.

As shown in FIG. 14, on a susceptor 102 in a treatment chamber 101, an annular compensation ring 103 is disposed, the compensation ring 103 being constituted in a sheet of disc like member. As shown in FIG. 14, the compensation ring 103 surrounds a periphery of a wafer W disposed on the susceptor 102, being exposed to the plasma during treatment. Accordingly, a successive treatment of a plurality of wafers ensues a high temperature of the compensation ring 103. A high temperature of the compensation ring 103 affects a spatial distribution of radicals. For instance, in the etching process, a decrease of an etch rate of photo resist at a periphery of the wafer W or a difficulty in forming a contact hole is caused. In particular, when a plurality of wafers W is successively treated, there occurs a variation of the etch rates between wafers treated at an earlier turn and at a later turn.

Technology for eliminating an influence of a high temperature of a member disposed in the surroundings of a sample to plasma-treat on the plasma treatment is disclosed for instance in Japanese Patent Publication (A) No. HEI 7-310187. In the publication, apparatus in which to prevent a protector plate 6 disposed in the surroundings of a sample 2 from becoming a high temperature, the protector plate 6 and a susceptor 8 are fastened with a bolt to come into an intimate contact is proposed. Thereby, thermal conduction is improved to cool the protector plate 6. Alternatively, between a base face of the protector plate 6 and an upper face of the susceptor 8, a gas is flowed as a thermal conduction medium to help heat of the protector plate 6 diffuse easily toward the susceptor 8.

SUMMARY OF THE INVENTION

In general, when a temperature of the compensation ring 103 in the treatment chamber 101 of plasma etching apparatus 100 goes up, the etch rate shows a tendency of decreasing from a center of the wafer W toward a periphery. The situation is shown in FIG. 15 as curve 1. The tendency is in accordance with a distribution of oxygen radicals shown by curve 2 shown by a dotted line in FIG. 15.

Accordingly, in order to prevent the etch rate from decreasing at the periphery side as shown by curve 1, it is considered needs only to cool the compensation ring to lower the temperature.

However, a shape of the curve 1 that shows, over a surface direction of the wafer W, the etch rate of the wafer W plasma-etched in the treatment chamber 101 is obviously different from that of the curve 2 that shows the distribution of the oxygen radicals. That is, the curve 1 rapidly goes up at the periphery. The steepness at the periphery side of the curve 1 cannot be explained only with the distribution of the oxygen radicals.

When changing a viewpoint to pay attention to treatment gas deposit piled up at a place relatively distant from the periphery of the wafer W on the susceptor 102, one answer can be obtained. That is, when the plasma impinging against the deposit layer formed by deposition of the treatment gas, highly reactive materials such as fluorine radicals or the like are considered to produce. Curve 3 in FIG. 15 is one obtained by plotting a distribution of thus generated fluorine radicals with distance from the center of the wafer W disposed on the susceptor as abscissa. As shown by the curve 3, in accordance with the rapid rise of the curve 1 in the neighborhood of the periphery of the wafer W, in the proximity of the periphery of the wafer W, an amount of the fluorine radicals rapidly increases.

From the above, a portion from a left hand side to the center of the curve 1, that is a portion from the center toward the periphery of the wafer W reflects an influence of the oxygen radicals shown by the curve 2. A portion of a right hand side of the curve 1, that is the surroundings of the periphery of the wafer W is considered to reflect an influence of fluorine radicals of the curve 3 that is considered to generate from the deposit.

When judging from a temperature distribution point of view only, it is only needed to cool the compensation ring. However, on the other hand, when the compensation ring is cooled, the fluorine radicals generated due to plasma bombardment on the deposit that is formed by deposition of material contained in the treatment gas become to largely affect. As a result, the etch rate at the periphery of the wafer W is considered to increase rapidly. That is an antinomic problem.

The present invention is made to overcome the aforementioned problems. That is, the object of the present invention is to provide apparatus and a method for plasma treatment where even after a successive treatment of a plurality of substrates to treat, quality of the treated substrates varies less due to the turn of the treatment and the treatment can be uniformly implemented over an entire substrate to treat.

DESCRIPTION OF PREFERRED EMBODIMENTS

Figure 1:
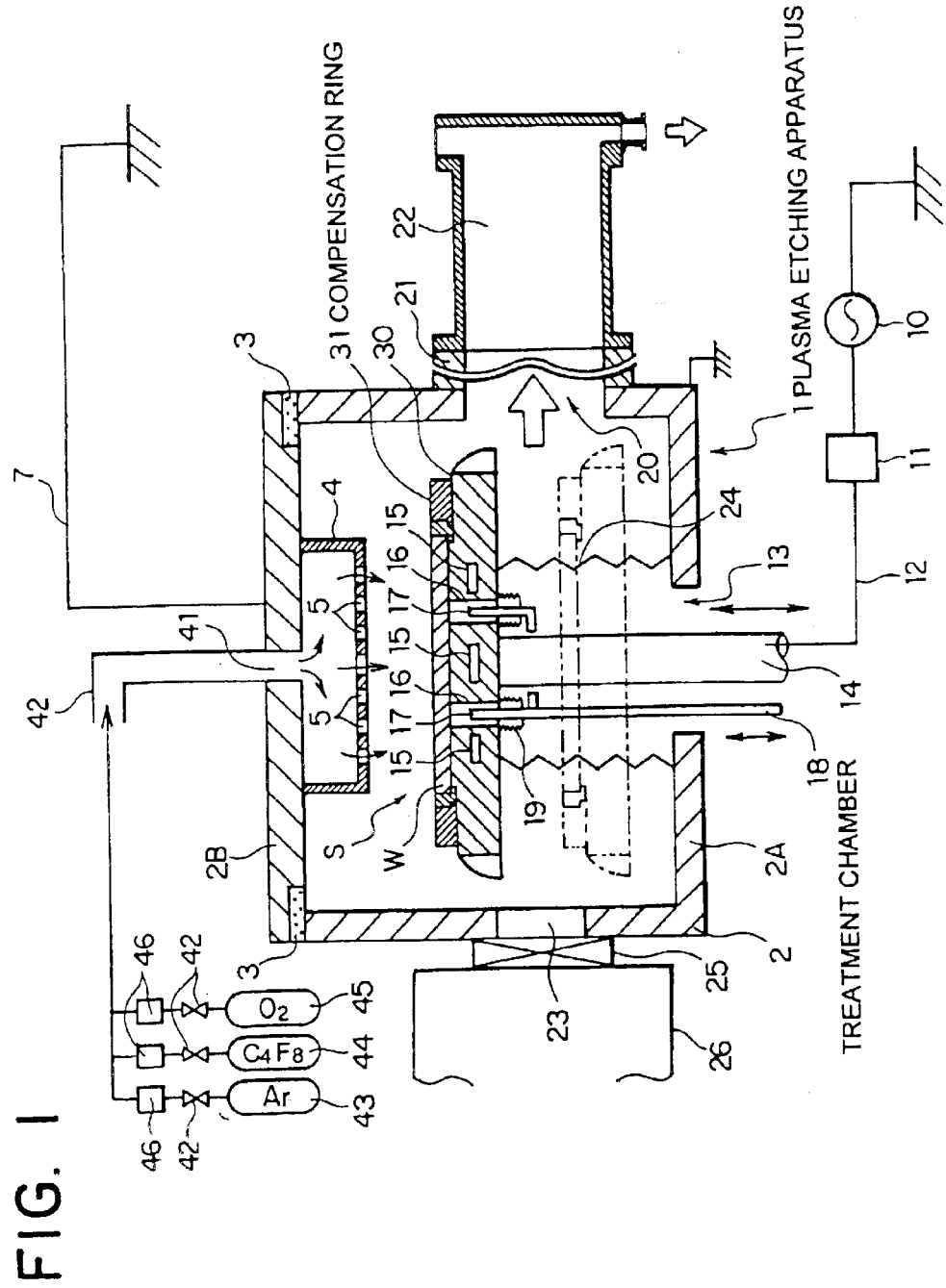
FIG. 1 is a vertical sectional view of apparatus for plasma etching involving a first embodiment of the present invention.

Apparatus for plasma treatment of the present invention comprises a treatment chamber, a treatment gas feeder, a plasma generating means, a susceptor, a first ring member and a second ring member. Here, in the treatment chamber, under an approximate vacuum, treatment is applied to a substrate to treat. The treatment gas feeder feeds the treatment gas to the substrate to treat. The plasma generating means generates plasma in the treatment chamber. On the susceptor, the substrate to treat is disposed. The first ring member surrounds a periphery of the substrate to treat disposed on the susceptor and is maintained at a first temperature during treatment. The second ring member surrounds a periphery of the first ring member and is maintained at a second temperature during the treatment.

In the aforementioned apparatus for plasma treatment, for instance the first temperature is set higher than the second one.

Furthermore, in the aforementioned apparatus for plasma treatment, at least an upper face of the first ring member is preferable to be provided with a width of 1 to 3 times mean free path of treatment gas molecules.

A value of the mean free path of the treatment gas molecules varies depending on the kind of the treatment gas or a treatment temperature. However, for instance one in which at least the upper face of the first ring member is provided with the width of 1 mm to 25 mm can be cited.

Furthermore, in the above apparatus for plasma treatment, means for cooling the second ring member is preferable to be provided with.

For the means for cooling, a known cooling system such as a jacket or a Peltier element can be used. However, for instance, a layer of thermal conductor that intervened between the second ring member and the susceptor can be cited.

Furthermore, on a base face of the first ring member, an unevenness may be formed to form point contact.

As an example of a combination of the first and second ring members, one can be cited in which the first ring member is provided with an approximately rectangular sectional shape with rectangular notches each formed on a top face on an inside periphery side and on a base face on an outside periphery side, and the second ring member is provided with an approximately rectangular section with a rectangular projection formed on a base face on an inside periphery side, wherein the first and second ring members each are provided with a shape capable of engaging detachably.

A method for plasma treatment of the present invention is one in which the plasma treatment is applied to a substrate to treat. In the present method, in a state where along a periphery of the substrate to treat an annular first temperature zone is formed and at the same time outside the first temperature zone a second temperature zone is formed, the plasma treatment is implemented onto the substrate to treat.

In the aforementioned method for plasma treatment, for instance the first temperature zone is set at a temperature higher than that of the second temperature zone.

Furthermore, in the aforementioned method for plasma treatment, the first temperature zone is preferable to be formed with a width of 1 to 3 times the mean free path of treatment gas molecules.

More specifically, the first temperature zone is preferable to be formed with a width in the range of 1 mm to 25 mm.

In the present apparatus for plasma treatment, a ring disposed in the surroundings of the substrate to treat is divided in first and second ring members. While the first ring member is maintained at a first temperature during the treatment, the second one is maintained at a second temperature. Accordingly, even after a successive treatment of a plurality of substrates to treat, there is found no quality variation between the treated substrates. As a result, the treated substrates can be obtained with stable quality.

In the following, one embodiment of the present invention will be explained based on accompanying drawings.

FIG. 1 is a vertical sectional view showing a schematic configuration of apparatus for plasma etching involving the present embodiment.

As shown in FIG. 1, apparatus for plasma etching 1 comprises a cylindrical treatment chamber 2 formed of aluminum or stainless steel, for instance. The treatment chamber 2 is grounded. Furthermore, on a periphery of the treatment chamber 2, a plurality of permanent magnets is arranged in circumference to form a dipole ring magnet (DRM, omitted in the drawing). By rotating the DRM, a rotating magnetic field can be formed in a space in the treatment chamber 2.

A ceiling 2B of the treatment chamber 2 is connected through an insulating member 3 to the treatment chamber body side, to the ceiling 2B a showerhead 4 of a flat hollow structure being disposed opposite to a susceptor 30. On a gas spray surface of a lower surface of the showerhead 4, a plurality of discharge openings 5, 5, - - - are bored. The discharge openings discharge a treatment gas or a plasma gas introduced in the showerhead 4 toward a treatment space S, that is a space formed between the lower surface of the showerhead 4 and an upper surface of the susceptor 30.

The showerhead 4 is made of conductive material; for instance aluminum of which surface is anodized or surface treated stainless steel to form an upper electrode, and is grounded through a conductor 7.

To a gas inlet 41 at an upper portion of the showerhead 4, a gas inlet pipe 42 is connected. The gas inlet pipe 42 is branched into plural lines, an Ar gas source 43 for reserving an Ar gas as the plasma gas, and etching gas sources 44 and 45 reserving etching gases of $C_4F_8$, and $O_2$ as the treatment gas being connected respectively thereto. The gases each, while being controlled in a flow rate by a mass flow controller 46 or a switching valve 42 disposed on the way, are fed.

On part of a sidewall of the treatment chamber 2, a wafer transfer opening 23 is disposed corresponding to a position the susceptor 30 is lowered, a gate valve 25 communicating with a transfer chamber 26 constituted to be evacuated being disposed.

A rear surface of the susceptor 30 and the surroundings of an opening 13 of the base 2A of the treatment chamber are connected by metallic bellows 24 constituted elastically. By means of the bellows 24, the susceptor 30 is elevated while maintaining airtightness.

To the susceptor 30, by means of a high frequency power source 10, through a feed line interposed by a matching circuit 11 and an elevating shaft 14, a high frequency voltage of for instance 13.56 MHz can be applied.

Furthermore, an exhaust opening 20 is disposed on a sidewall opposite to the wafer transfer opening 23, thereto 20 a vacuum piping 21 being connected. To the vacuum piping 21, a vacuum pump 22 is furnished, the vacuum pump 22 being operated to evacuate the air in the treatment chamber 2. Thereby, an approximate vacuum state can be realized inside of the treatment chamber 2.

Inside of the treatment chamber 2, as a lower electrode the susceptor 30 of approximate disc shape and consisting of conductive materials such as aluminum or stainless steel is disposed. The susceptor 30 is fixed and supported on an upper end of the elevating shaft 14 inserted through the opening 13 at the center of the base 2A of the treatment chamber, being disposed movable up and down by means of an elevating system (omitted in the drawing). During the operation of the plasma etching apparatus 1, with the wafer W on the upper surface of the susceptor 30, the etching is implemented.

A passage like cooling jacket 15 is disposed inside the susceptor 30. By passing a coolant through the inside of the jacket 15, the susceptor 30, resultantly the wafer W disposed thereon, can be maintained at a desired temperature. Furthermore, at prescribed positions of the susceptor 30, a plurality of lifter openings 16, 16, - - - are bored penetrating through in an up and down direction, corresponding to the lifter openings 16, 16, - - - , wafer lift pins 17 being disposed movable in an up and down direction. The wafer lifter pins 17 are attached integrally movable up and down by a pin-elevating rod 18 attached movable up and down through the opening 13 of the base 2A of the treatment chamber. To the through hole of the wafer lifter pin 17, between the rear surface of the susceptor 30 elastic metallic bellows 19 are disposed, enabling the wafer lifter pins 17 to move up and down while maintaining airtightness. In a state holding the susceptor 30 at a position shown by a chain line in FIG. 1, the wafer lifter pins 17 are moved up and down to elevate the wafer W. Three pieces of such wafer lifter pins 17 are usually arranged along a periphery of the wafer W.

An annular compensation ring 31 is disposed on an upper surface of the susceptor 30.

Figure 2:
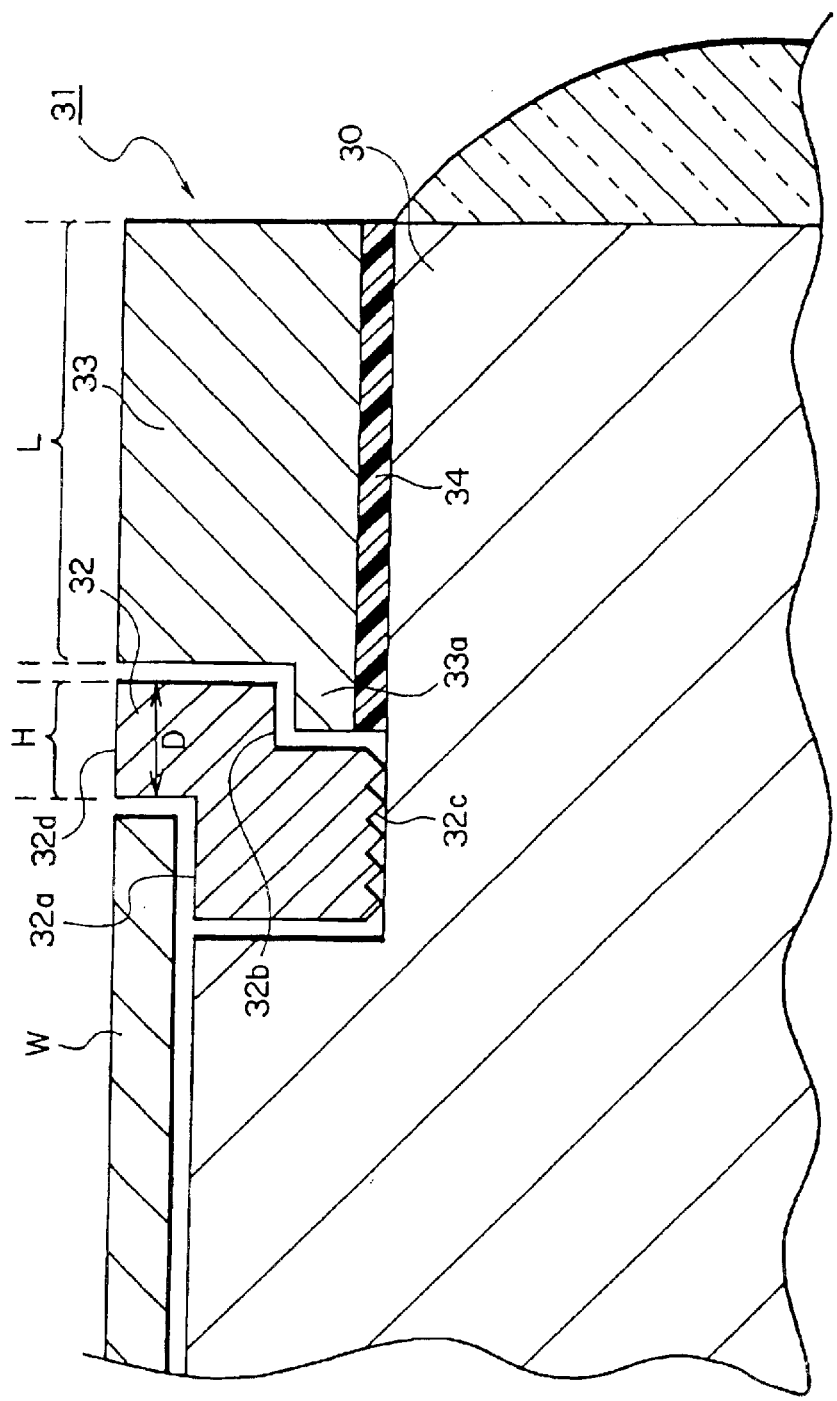
FIG. 2 is a vertical sectional view where an upper portion of a susceptor involving a first embodiment is partially enlarged.
Figure 3:
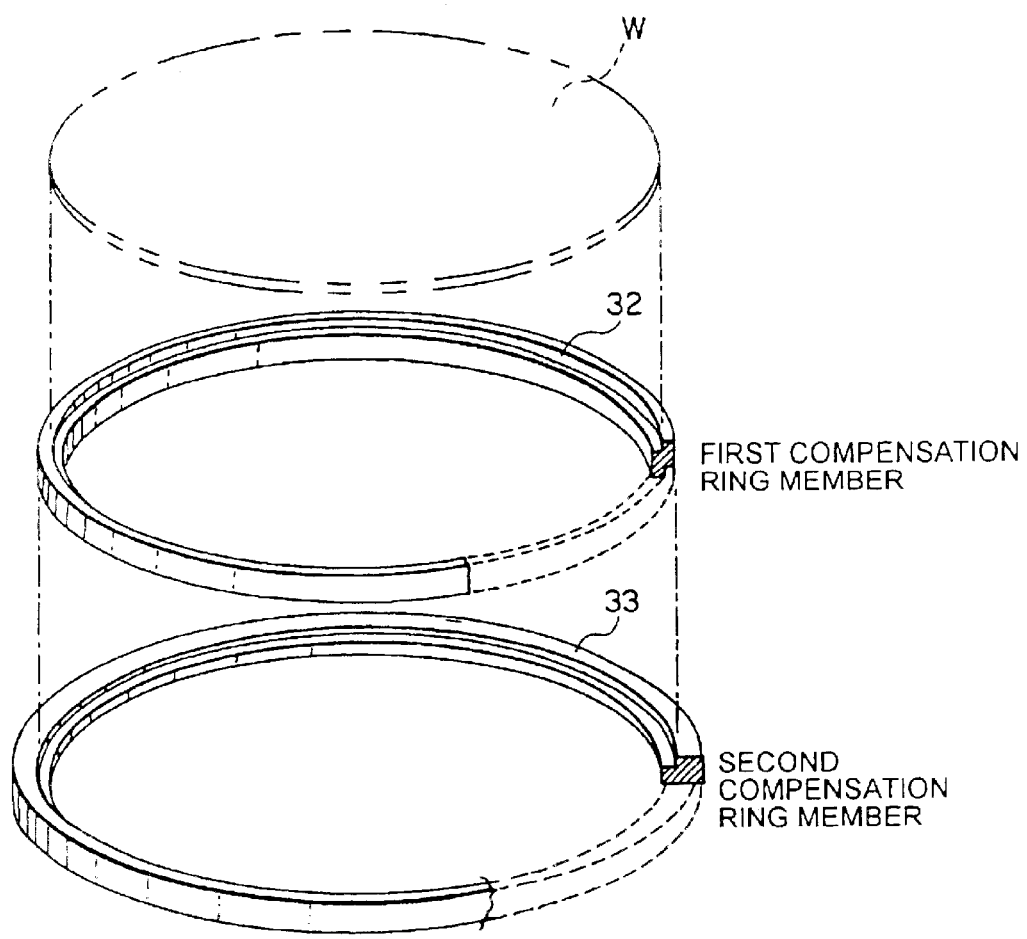
FIG. 3 is a perspective view of a compensation ring involving a first embodiment.

FIG. 2 is a partially enlarged vertical section of the upper portion of the susceptor 30 involving the present embodiment, FIG. 3 being an exploded perspective view of the compensation ring 31 involving the present embodiment.

As shown in FIGS. 2 and 3, the compensation ring 31 is constituted of two concentric annular members. One of the annular members is a first compensation ring member 32, the other one being a second compensation ring member 33.

These two compensation ring members 32 and 33 are engaged to constitute one compensation ring 31.

That is, the first compensation ring member 32, as shown in FIG. 2, in a section thereof, is provided with a rectangular notch 32a at a top portion on an inside periphery side. In addition, similarly, at a base portion on an outside periphery, a rectangular notch 32b is formed.

The notch 32a at the top portion on the inside periphery side of the first compensation ring member 32, as shown in FIG. 2, is engaged with the outside periphery of the wafer W when set on the susceptor 30.

Furthermore, on the base of the first compensation ring member 32, a relatively coarse unevenness 32c is formed to come into point contact with the upper surface of the susceptor 30. This is to inhibit the upper surface of the susceptor 30 and the base surface of the first compensation ring member 32 to come into contact through a face. When the base surface of the first compensation ring member 32 and the upper surface of the susceptor 30 come into contact through a smaller area, thermal conduction between the first compensation ring member 32 and the susceptor 30 is lowered. Thereby, a temperature of the first compensation ring member 32 heated due to exposition to the plasma during treatment of the wafer W is suppressed from going down. The unevenness on the base surface 32c may be omitted.

At the base portion on the outside periphery side of the first compensation ring member 32 also, a notch 32b rectangular in section is formed. The notch 32b is given to engage with the second compensation ring member 33 described later.

The second compensation ring 33 is provided with a projection 33a rectangular in section at the base portion on the inside periphery side, the projection 33a forming a flange like projection.

The projection 33a has a shape just engaging with the notch 32b of the base on the outside periphery side of the aforementioned first compensation ring member 32. When the first and second compensation ring members 32 and 33 are set on the susceptor 30, the notch 32b and the projection 33a are engaged, thereby the first and second compensation ring members 32 and 33 forming together the compensation ring 31. That is, as shown in FIG. 2, when the first and second compensation ring members 32 and 33 are set on the susceptor 30, the respective upper surfaces of the first and second compensation ring members 32 and 33 form the same plane. Between the base of the second compensation ring member 33 and the upper surface of the susceptor 30, a layer of thermally conductive material, for instance a layer of silicone rubber 34 is interposed as the cooling means. The layer of silicone rubber 34 is excellent in thermal conduction, an intimate contact thereof with the base of the second compensation ring member 33 and the upper surface of the susceptor 30 helping heat transfer between the second compensation ring member 33 and the susceptor 30. Accordingly, when, during the operation of the treatment apparatus, a temperature of the second compensation ring member goes up, through the layer of silicone rubber 34, heat diffuses from the second compensation ring member 33 to the susceptor 30. The susceptor 30 is always cooled by means of a built-in jacket. As a result, the second compensation ring member 33 is also cooled to suppress the temperature from going up.

As the material of the second compensation ring member 33, for instance Si, $SiO_2$, SiC, $Al_2O_3$, AlN, and $Y_2O_3$ can be cited.

As shown in FIG. 2, the first compensation ring member 32 is formed in a sectional shape of an approximate rectangle or a hook in which the notch 32b on the base on the outside periphery side and the notch 32a on the inside periphery side are formed. Accordingly, the first compensation ring member 32 is formed detachable from the second compensation ring member 33 and the susceptor 30, as shown in FIG. 3, the first compensation ring member 32 being easily detached by lifting in an axial direction thereof.

Accordingly, when the first compensation ring member 32 itself is etched to be thin in its thickness, the first compensation ring member 32 alone can be replaced to be economical. Furthermore, there is an advantage that due to easy replacement maintenance does not cause trouble.

Furthermore, as shown in FIG. 2, the first compensation ring member 32 is formed in a magnitude and shape that do not necessarily come into intimate contact with the second compensation ring member 33 or the susceptor 30 over an entire surface thereof, but can form gaps. In the gaps, when the inside of the treatment chamber 2 is maintained in an approximate vacuum as during the operation of the plasma treatment apparatus, gaseous molecules hardly exist. Accordingly, the gaps function as a heat insulating layer. As a result, between the first and second compensation ring members 32 and 33 or between the first compensation ring member 32 and the susceptor 30, during the operation of the plasma etching apparatus 1, the heat transfer can be suppressed to a negligible level.

As the material of the first compensation ring member 32, though Si being used, other than Si, for instance $SiO_2$, SiC, $Al_2O_3$, AlN and $Y_2O_3$ can be cited.

A width D of an upper surface 32d of the first compensation ring member 32 is set at one that can effectively scavenge reactive products, that is, can remove unnecessary free radicals, and does not damage uniformity of thermal distribution in the treatment chamber 2. Here, the reactive products are such as fluorine radicals or the like and considered to be generated from a treatment gas deposit piled up on the surface of the susceptor 30.

A value of the width D varies depending on the conditions such as the kind and temperature of the treatment gas, and a vacuum. However, it is preferable for instance to be a level comparable with mean free path λ of the treatment gas molecules, for instance to be in the range of 1 to 5 times the mean free path λ, more preferable to be in the range of 1 to 3 times the mean free path λ.

When citing a more specific numerical value, for instance the value of the width D in the range of 1 to 25 mm can be cited. The width D corresponds to the width of the first temperature zone formed in the treatment chamber 2 during the operation of the plasma etching apparatus.

The reason for restricting a preferable range of the width D of the first compensation ring member 32 to the aforementioned range is as follows. When the width D is less than the aforementioned range, during the treatment, a width of the first temperature zone that is a cylindrical temperature zone formed-in the neighborhood of the upper surface of the first compensation ring member 32 becomes smaller.

When the width of the first temperature zone becomes smaller than the lower limit of the aforementioned width D, the capability of the first temperature zone to scavenge fluorine radicals decreases. Here, the fluorine radicals are formed by the bombardment of the plasma on the deposit piled up on the upper surface of the second compensation ring member 33. As a result, a sufficient scavenge is not carried out, the fluorine radicals that are not scavenged to remain reaching an outside periphery of the wafer W to result in an increase of an etch rate on the upper surface of the wafer W.

On the other hand, when the width D exceeds the aforementioned range, during the treatment, a width of the first temperature zone that is a cylindrical temperature zone formed in the neighborhood of the upper surface of the first compensation ring member 32 becomes larger.

When the aforementioned width D of the first temperature zone becomes larger than the upper limit, probability with which gas molecules that do not contribute to the treatment, for instance gaseous molecules of Ar or the like, collide against the upper surface 32d of the first compensation ring member 32 increases. When the probability with which the gaseous molecules such as Ar or the like collide against the upper surface 32d of the first compensation ring member 32 increases, the thermal distribution in the treatment chamber 2 is disturbed in its uniformity. As a result, the treatment of the wafer W is damaged in its uniformity.

Thus, by restricting the width D of the first compensation ring member in the aforementioned range, over an entire upper surface of the susceptor including the disposed wafer W, the thermal distribution can be maintained uniform. At the same time, the fluorine radicals can be scavenged by the first temperature zone formed in the neighborhood of the upper surface of the first compensation ring member. Here, the fluorine radicals are formed due to the bombardment of the plasma against the deposit piled up on the second compensation ring member 33 outside of the periphery of the wafer W. As a result, local etching in the neighborhood of the periphery of the wafer W due to the fluorine radicals can be suppressed from proceeding.

Next, etching treatment that is implemented with thus configured plasma etching apparatus will be explained.

Upon turning on cluster tool apparatus where the aforementioned plasma etching apparatus 1 is mounted (omitted in the drawing), a wafer W, through a carrier cassette, a transfer arm and a load lock chamber all of which is omitted from showing in the drawing, is transferred into a transfer chamber 26 disposed adjacent to the treatment chamber 2 of the plasma etching apparatus 1.

Then, in the transfer chamber 26 the transfer arm (omitted in the drawing) rotates and stops facing to a front face of the plasma etching apparatus 1. Thereafter, a gate valve 25 in front of the plasma etching apparatus 1 is opened, the transfer arm holding an untreated wafer W being proceeded into the treatment chamber 2 of the plasma etching apparatus 1.

On the other hand, in the treatment chamber 2, the susceptor 30 is lowered downward in the treatment chamber 2 as shown by a chain line of FIG. 1. In this state, the untreated wafer W is transferred from the transfer chamber 26 side through the wafer transfer inlet 23 into the treatment chamber 2, followed by disposing on the susceptor 30.

Next, the elevating shaft 14 is moved upward to ascend the susceptor 30, the wafer W disposed on the upper surface thereof being effected to approach the lower surface of the showerhead 4.

Then, in this state, while feeding from the showerhead 4 a prescribed amount of a plasma gas or an etching gas into the treatment chamber 2, the inside of the treatment chamber 2 is evacuated. The evacuation is carried out after the gate valve 25 of the wafer transfer inlet 23 of the treatment chamber is sealed. When the gate valve 25 is lowered to close the wafer transfer inlet 23 and the treatment chamber 2 is sealed, the vacuum pump 22 starts to evacuate.

By keeping on rotating the vacuum pump 22 with the rotational speed, the treatment chamber 2 is maintained at a process pressure. At the same time, between the susceptor 30 that is a lower electrode and an upper electrode a high frequency voltage of for instance 13.56 MHz is applied to generate plasma in a treatment space S. With the plasma, for instance an oxide film formed on the surface of the wafer W is etched.

Most of the plasma generated upon the start of the treatment collides against the upper surface of the wafer W to etch the oxide film on the upper surface of the wafer W. In addition to this, some of the generated plasma spreads to the extent broader than the outside periphery of the wafer W to reach, exceeding the upper surface 32d of the first compensation ring member 32, the upper surface of the second compensation ring member 33.

At this time, the first compensation ring member 32, being disposed at a position closer to the periphery of the wafer W, is exposed much to the plasma to become a high temperature in a short time. The first compensation ring member 32, being composed of material small in heat capacity, is heated to a prescribed temperature within a relatively short time to be balanced there. Thus, the first compensation ring member 32 stabilizes thermally at a high temperature.

Furthermore, on the base face of the first compensation ring member 32, there is formed coarse unevenness 32c. Accordingly, a contact area between the first compensation ring member 32 and the upper surface of the susceptor 30 is very small, that is, a state close to so-called point contact being formed. Accordingly, between the first compensation ring member 32 and the upper surface of the susceptor 30 gaps are formed. However, during the treatment, since the treatment chamber 2 is maintained in an approximate vacuum, there hardly exist molecules of the air in the gaps. As a result, the first compensation ring member 32 is thermally sealed from the susceptor 30 and the second compensation ring member 33 to be maintained at a high temperature with stability. Accordingly, during the treatment, in the neighborhood of the upper surface 32d of the first compensation ring member 32, the first temperature zone H of high temperature is formed.

On the other hand, the second compensation ring member 33 is so configured that heat can be easily transferred through the susceptor 30 cooled by the jacket and the silicone rubber layer 34. Accordingly, when, due to the plasma bombardment or transfer of environmental heat, the heat is supplied to the second compensation ring member 33, the second compensation ring member 33, being cooled through the susceptor 30 and the silicone rubber layer 34, does not become so high in temperature. As a result, the second compensation ring member 33 is maintained at a lower temperature than that of the first compensation ring member 32.

As a result, in the neighborhood of the upper surface of the second compensation ring member 33, the second temperature zone L of relatively low temperature is formed.

Thus, during the treatment, in the periphery of the wafer W the first temperature zone H due to the first compensation ring member 32 is formed with a narrow width D, further outside thereof the second temperature zone L due to the second compensation ring member 33 being formed.

During the treatment, in the treatment chamber 2, several kinds of gas molecules including the treatment gas molecules are moving around. Some of these collide against the second compensation ring member 33. However, since the second compensation ring member 33 is maintained at a relatively low temperature, the thermal distribution in the treatment chamber 2 is not so much disturbed. Furthermore, inside the second compensation ring member 33, the first compensation ring member 32 of high temperature is disposed. However, the width D thereof is set such narrow as 1 to 3 times or 1 to 5 times the mean free path $\lambda$ of the treatment gas molecules. As a result, the number of the gas molecules colliding against the upper surface 32d of the first compensation ring member 32 is very small. Accordingly, the gas molecules that collide against the upper surface 32d thereof and obtain high energy to increase energy give an influence of negligible extent on a treatment gas atmosphere in the treatment chamber 2. As a result, when observing over an entire treatment gas atmosphere in the treatment chamber 2, over an entire upper surface of the susceptor 30, a uniform temperature distribution is attained, resulting in enabling the uniform etching between a center of the wafer W and the periphery thereof.

On the other hand, some of the material constituting the treatment gas stick and deposit on the surface of the second compensation ring member 33. Upon the plasma colliding against the deposit, reactive products such as the fluorine radicals high in corrosiveness are considered to generate. Such reactive products, when diffusing from the second temperature zone L at the upper portion of the second compensation ring member 33 toward the position where the wafer W is disposed, have to go through the first temperature zone H. The first high temperature zone H due to the first compensation ring member 32 exists between the second temperature zone L and the wafer W.

At that time, the first temperature zone H is maintained at a sufficiently high temperature. Before passing through the first temperature zone H, the reactive products such as fluorine radicals or the like diffused from the second temperature zone L react on the surface of the first compensation ring member 32, that is, the first temperature zone H. Thereby, the reactive products are converted into other materials to lose reactivity. As a result, the reactive products diffused from the first temperature zone H to the wafer W are substantially removed, resulting in previous prevention of an influence on the wafer W.

Upon completion of the desired etching after a prescribed time period of etching treatment, a vacuum in the treatment chamber 2 is lowered to a level of vacuum a little bit higher than in the transfer chamber 26. Thereafter, with the reversed turn from the above, the treated wafer W is taken out of the treatment chamber 2. Then, similarly with the above, the wafer W is transferred into a succeeding treatment chamber, therein prescribed treatment being implemented. After the completion of a series of treatments, the treated wafer W is taken out of the last treatment chamber into the transfer chamber 26, and further being sent from the transfer chamber 26 through the load lock chamber to be accommodated again in the carrier cassette. Thus, the treatment is over.

As explained in the above, the first plasma treatment apparatus 1 involving the present embodiment comprises the first compensation ring member 32; and the second compensation ring member 33. Here, the first compensation ring member 32 is disposed immediately outside of a wafer W position on the susceptor 30 and has a width of an identical extent with the mean free path of the treatment gas, thereby enabling to restrict heat transfer. The second compensation ring member 33 is disposed immediately outside of the first compensation ring member 32, being formed in a structure where heat is easily released by the use of the layer 34 of silicone rubber to the susceptor 30 side. Accordingly, during the treatment, in the surroundings of the first compensation ring member the first temperature zone H is established on one hand. On the other hand, outside of the first temperature zone H the second temperature zone L of relatively low temperature is formed due to the second compensation ring member 33.

As a result, the temperature distribution on the susceptor 30 becomes high in the neighborhood of the center thereof and low in the surroundings of the second compensation ring member 33 on the periphery. Accordingly, in observing the entire surface of the wafer W, the treatment with the uniform etch rate can be implemented over the entire surface.

On the other hand, in the neighborhood of the periphery of the wafer W disposed on the susceptor 30, the first compensation ring member 32 of a narrow width, that is, of a width of an extent similar with the mean free path of the treatment gas molecules is interposed. The first compensation ring member 32 is maintained at a high temperature during the treatment. Accordingly, in the neighborhood of the upper surface of the first compensation ring member 32, the first temperature zone H of high temperature is formed. Due to the operation of the first temperature zone H, corrosive materials such as fluorine radicals or the like formed in the neighborhood of the second compensation ring member 33 are scavenged. As a result, the corrosive materials such as fluorine radicals or the like are suppressed in advance from diffusing up to the periphery of the wafer W to etch locally.

The present invention is not restricted to the content of the aforementioned embodiment of the present invention. For instance, in the aforementioned embodiment, the plasma etching apparatus for Si wafer is explained as an illustration. However, the present invention can be applied in, other than that, reactive gas treatment apparatus for instance CVD.

Furthermore, the present invention can be applied in the treatment apparatus of glass substrates for LCD as well as the Si substrates.

Furthermore, in the above embodiments, rotating magnetic field type treatment apparatus is explained as an example. The rotating magnetic field type treatment apparatus has a so-called dipole ring magnet (DRM) in which a plurality of cylindrical permanent magnets is effected to rotate around the treatment chamber. However, the present invention also can be applied in the treatment apparatus where the dipole ring magnet (DRM) is not mounted.

In the following, by the use of the plasma etching apparatus 1 explained in the aforementioned implementation mode and with various kinds of compensation rings, the wafers are etched.

FIGS. 4 through 9 are graphs showing the relationship between distance from a wafer center and etch rate.

Figure 4:
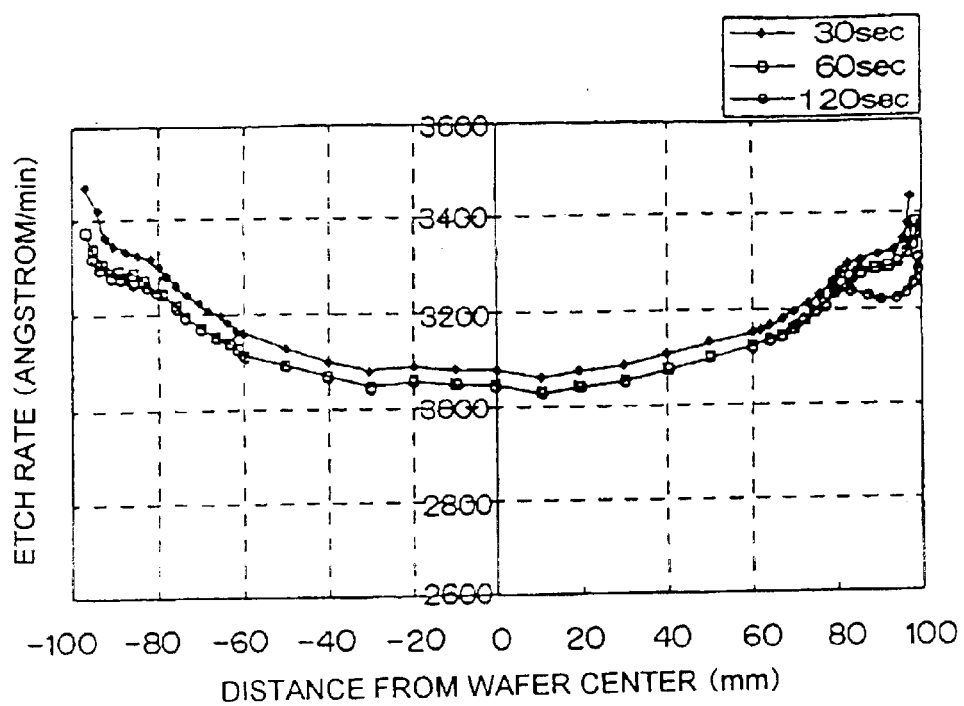
FIG. 4 is a graph showing the relationship between distance from a wafer center and etch rate of silicon dioxide film when an existing compensation ring is used without cooling.
Figure 5:
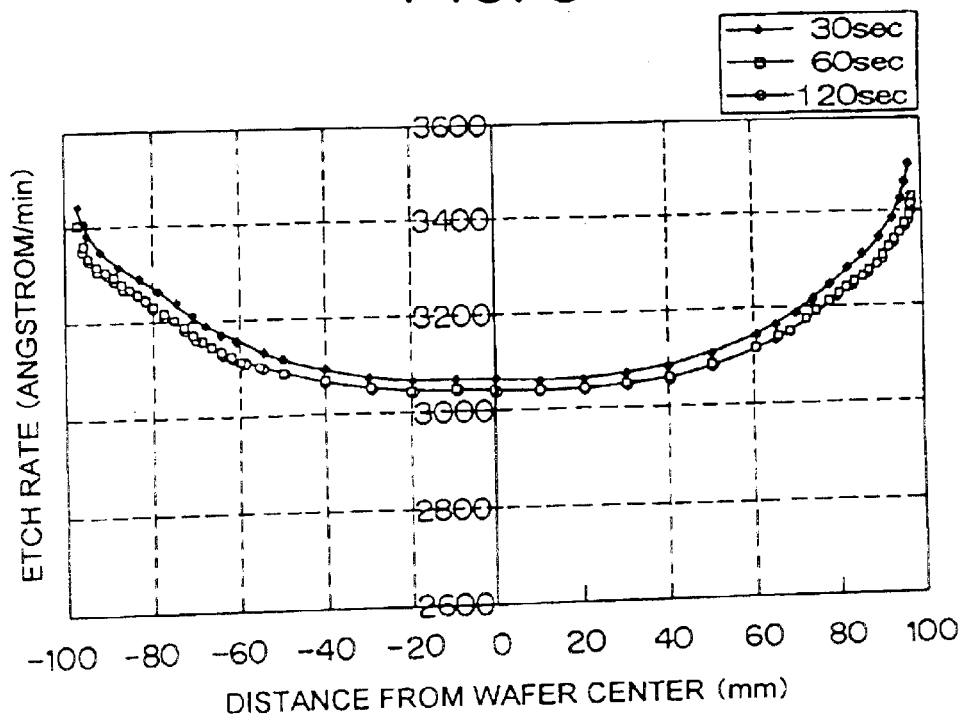
FIG. 5 is a graph showing the relationship between distance from a wafer center and etch rate of silicon dioxide film when an existing compensation ring is used while cooling.
Figure 6:
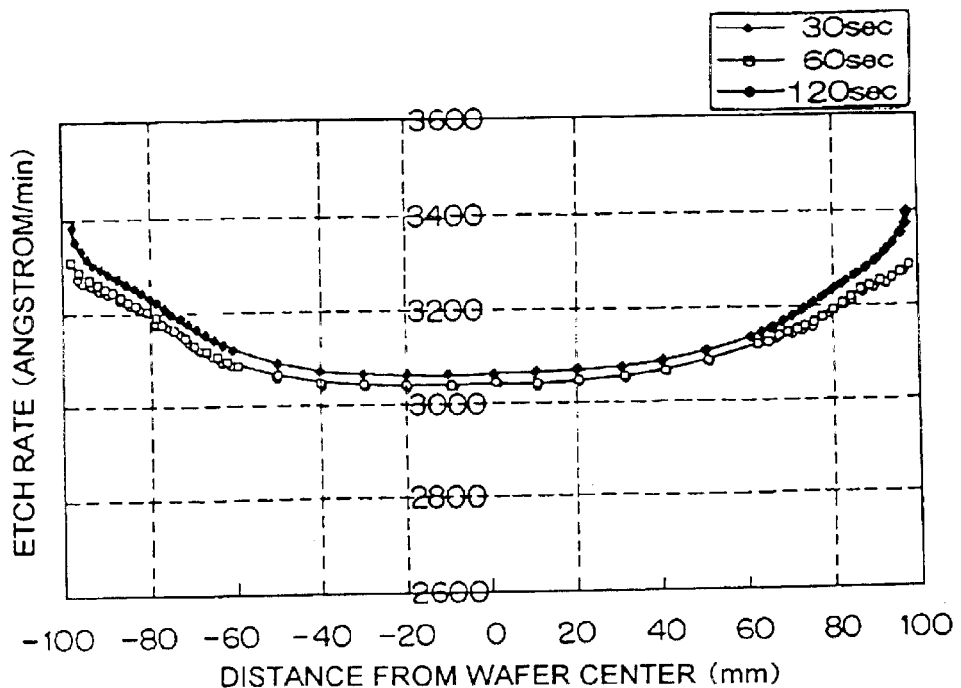
FIG. 6 is a graph showing the relationship between distance from a wafer center and etch rate of silicon dioxide film when a compensation ring involving a first embodiment is used.

FIG. 4 is a graph showing results of plasma etching of silicon dioxide films formed on the surfaces of the wafers when one of existing thin annular compensation ring is used without cooling. FIG. 5 is a graph showing results of plasma etching of silicon dioxide films formed on the surfaces of the wafers when one of existing thin annular compensation ring is used while cooling. FIG. 6 is a graph showing results of plasma etching of silicon dioxide films by the use of a compensation ring capable of dividing concentrically into the first and second compensation ring members while cooling the second compensation ring member.

In each graph, continuous lines each show data of one piece of wafer, the measurements being carried out of three pieces of wafers at 30, 60 and 120 sec after the start of measurement, respectively.

When comparing FIGS. 4 and 6, curves of FIG. 6 showing results of divided compensation ring members show smaller scattering between the wafers at positions more than 60 mm outside to left and right sides from the center. Furthermore, time dependence of the etch rate in the neighborhood of the periphery is smaller. Thus, the etch rate is stable.

When comparing FIGS. 5 and 6, curves of FIG. 6 show smaller gradients of curves at portions more than 60 mm outside to left and right sides from the wafer center. Thus, the etch rates vary less there to show that difference of the etch rates is small within the plane.

Figure 7:
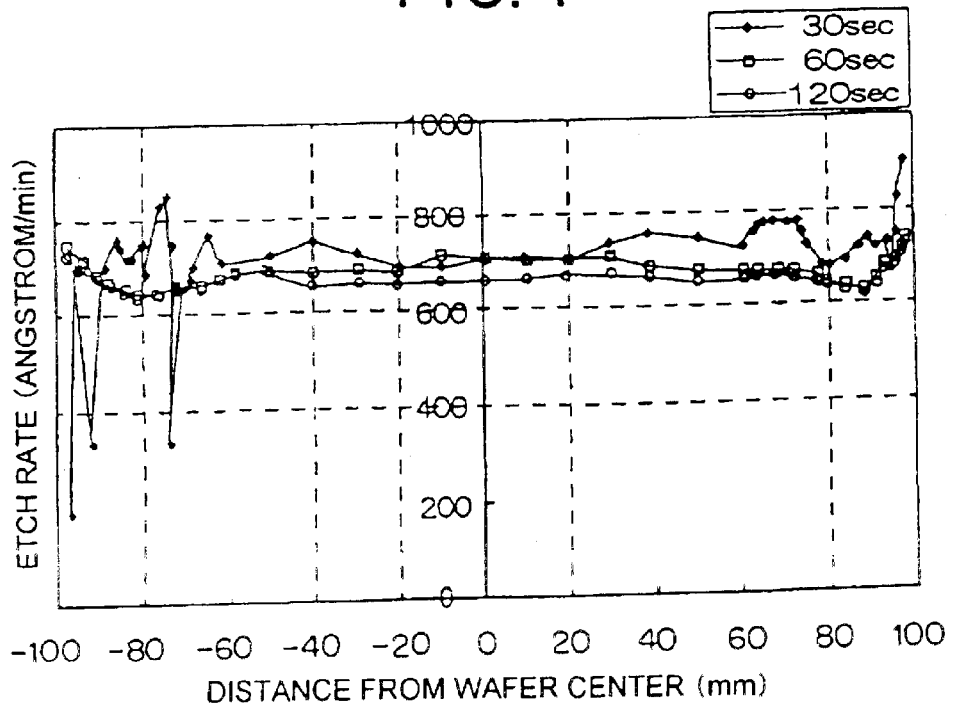
FIG. 7 is a graph showing the relationship between distance from a wafer center and etch rate of resist film when an existing compensation ring is used without cooling.
Figure 8:
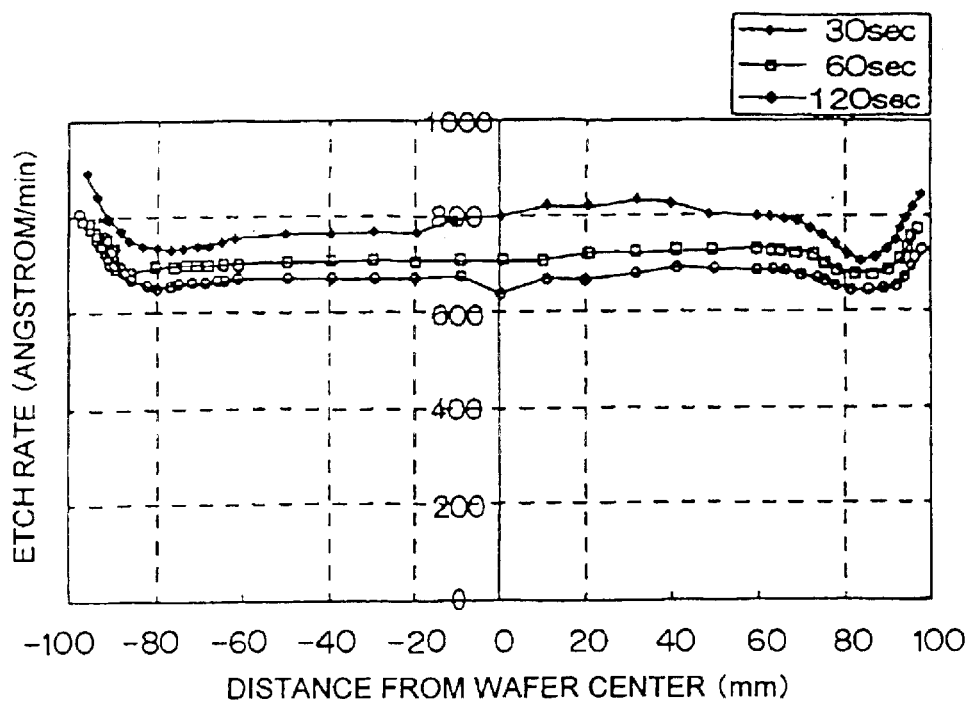
FIG. 8 is a graph showing the relationship between distance from a wafer center and etch rate of resist film when an existing compensation ring is used while cooling.
Figure 9:
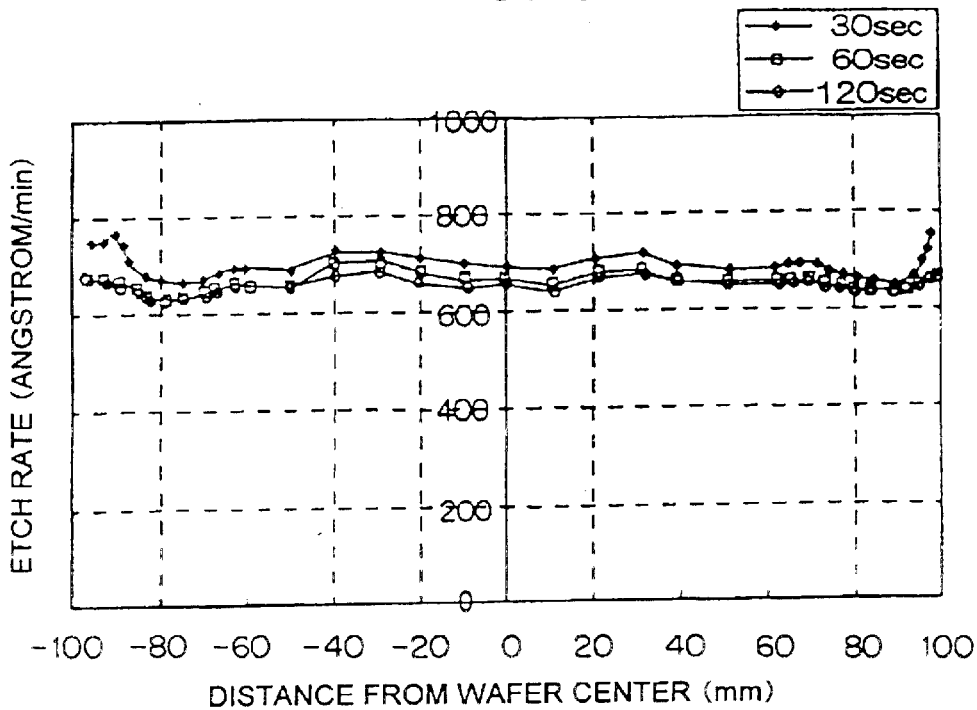
FIG. 9 is a graph showing the relationship between distance from a wafer center and etch rate of resist film when a compensation ring involving a first embodiment is used.

FIG. 7 is a graph showing results when one existing annular compensation ring is used without cooling and plasma etching is implemented on a resist film formed on the wafer surface. FIG. 8 is a graph showing results when one existing annular compensation ring is used while cooling and plasma etching is implemented on a resist film formed on the wafer surface. FIG. 9 is a graph showing results when plasma etching is applied to a resist film with a compensation ring capable of dividing concentrically into the first and second compensation ring members while cooling the second compensation ring member.

In the respective graphs, continuous curves each show data of one wafer, measurement being implemented of three wafers at 30, 60 and 120 sec, respectively, after the start of the measurement.

When comparing FIGS. 7 and 9, three curves of FIG. 9 showing results of the divided compensation ring are approximately equal in shape thereof. In the portion more than 60 mm outside from the center, variation between the wafers, that is, the time dependence of the etch rate is small. Accordingly, the etch rate at the periphery is stable.

When comparing FIGS. 8 and 9, curves of FIG. 9 show smaller variation of the etch rate in the portion more than 60 mm outside from the center, that is, the difference of the etch rate within a wafer plane being small.

From the above results, when the plasma etching is implemented with the compensation ring 31 involving the present embodiment, the variation of the etch rate between the wafers different in treatment order is smaller. Accordingly, uniform etching small in the variation of the etch rate between the wafer center and the neighborhood of the periphery can be implemented.

Figure 10:
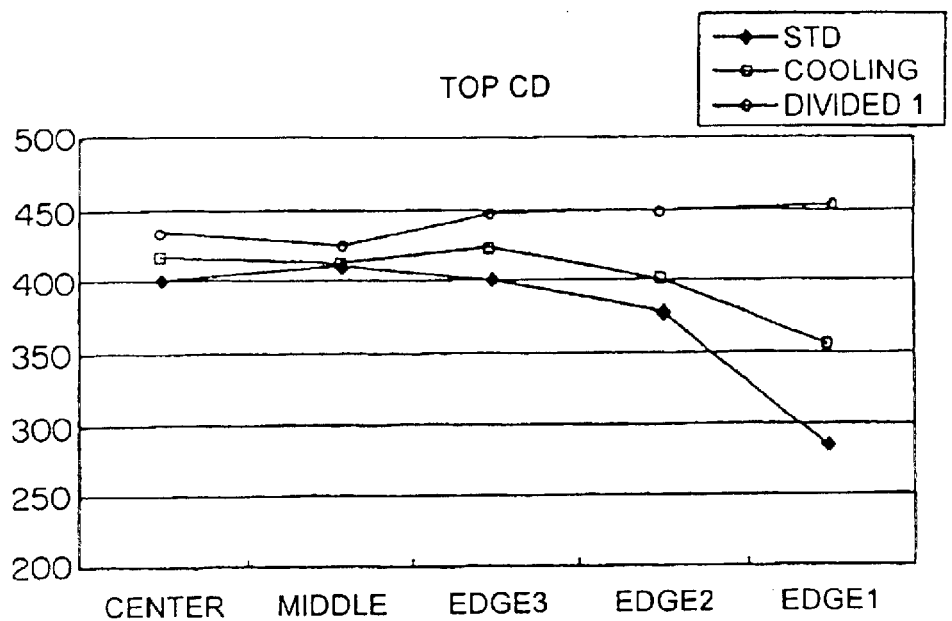
FIG. 10 is a graph showing the relationship between diameter of a through hole bored by etching a silicon dioxide film on a wafer and distance from a wafer center.
Figure 11:
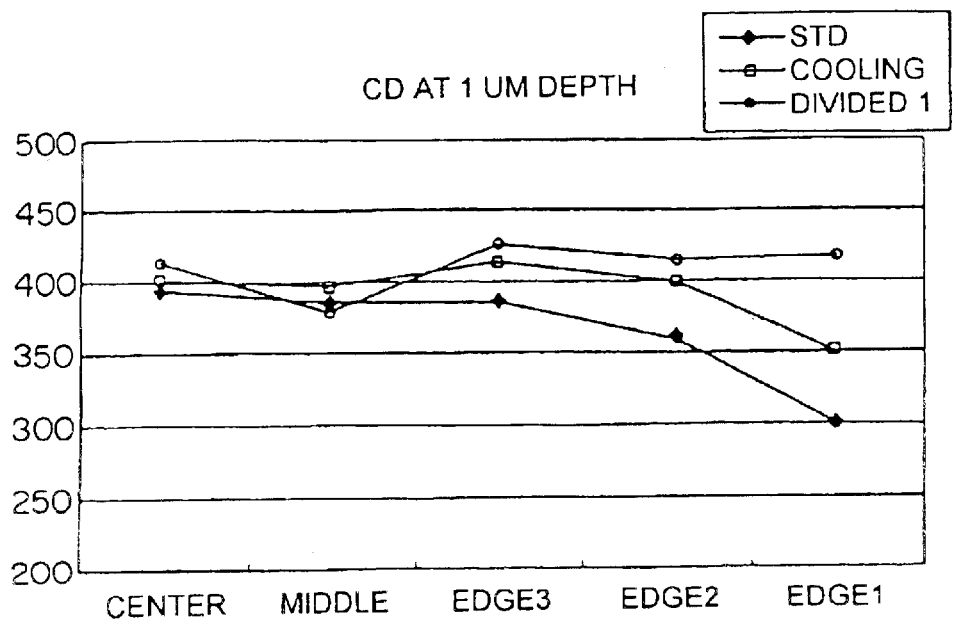
FIG. 11 is a graph showing the relationship between diameter of a through hole bored by etching a silicon dioxide film on a wafer and distance from a wafer center.
Figure 12:
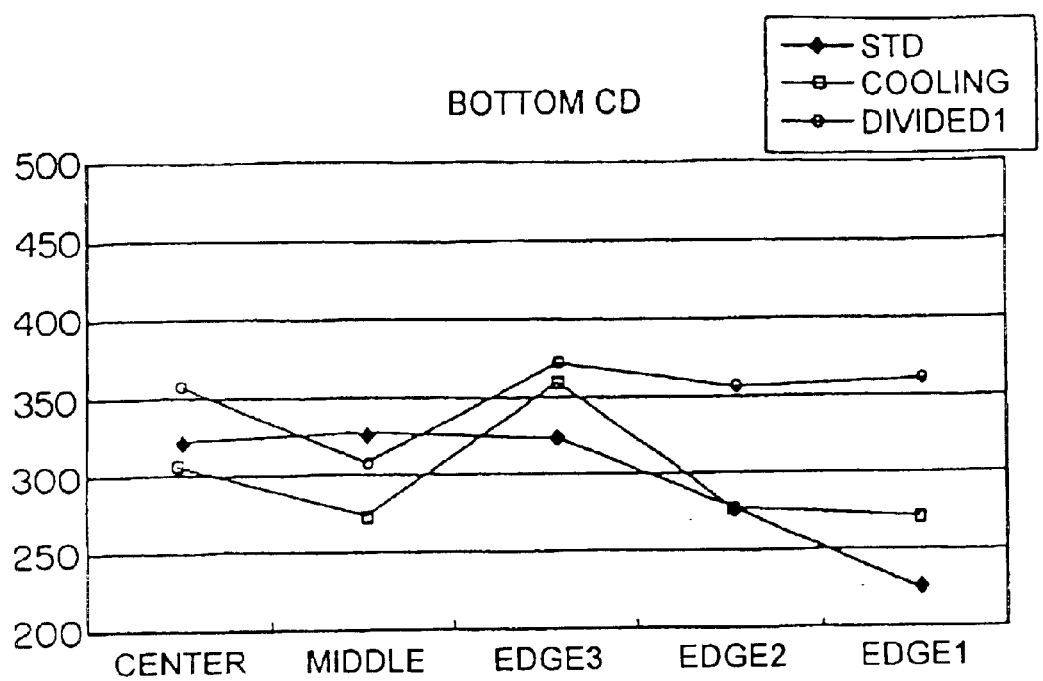
FIG. 12 is a graph showing the relationship between diameter of a through hole bored by etching a silicon dioxide film on a wafer and distance from a wafer center.

Next, FIGS. 10 to 12 are graphs showing the relationship between diameter of a through hole and distance from the wafer center when a silicon dioxide film formed on the surface of the wafer is etched to form a through hole. In the respective graphs, three curves are shown. One is a curve (STD) when a through hole is formed with an existing annular compensation ring without cooling. Another one is a curve (Cooling) when a through hole is formed with an existing annular compensation ring while cooling. And the last one is a curve (Divided 1) when a through hole is formed while cooling the second compensation ring member of the bisected compensation ring of the present invention. FIG. 10 shows values of diameters in the proximity of an apex of the through hole, FIG. 11 showing values of diameters in the vicinity of the center of the through hole, FIG. 12 showing values of diameters at the base of the through hole.

As evident from the FIGS. 10 to 12, the diameter of any portion of the through hole, which is formed by the use of the compensation ring of the present embodiment, is less in variation of the value of the diameter over from the wafer center to the periphery. That is, the through hole with uniform magnitude can be formed.

In the following, a second embodiment of the present invention will be explained. Of the present embodiment, the content duplicating with the preceding embodiment is omitted from the explanation.

Figure 13:
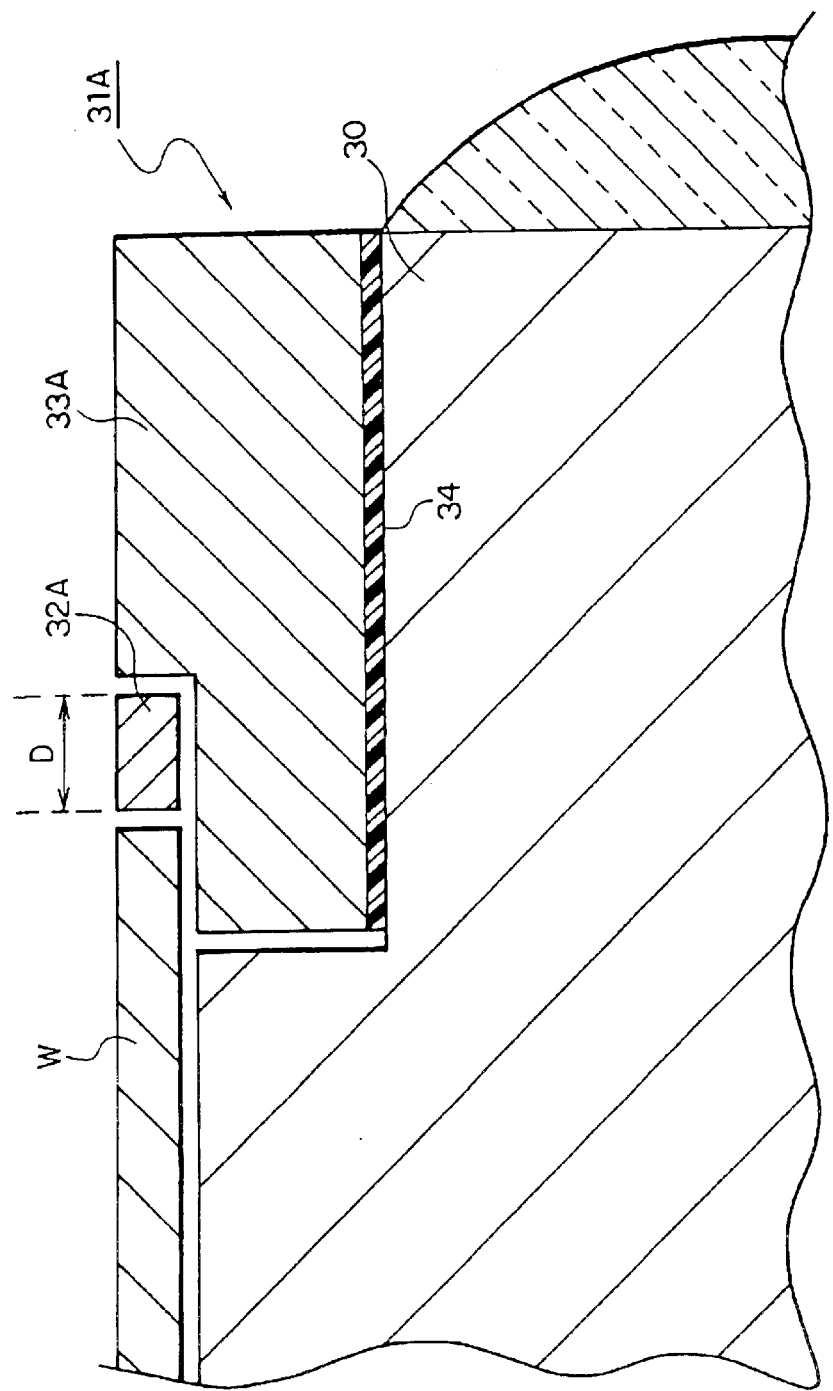
FIG. 13 is a vertical sectional view of a compensation ring involving a second embodiment of the present invention.
Figure 14:
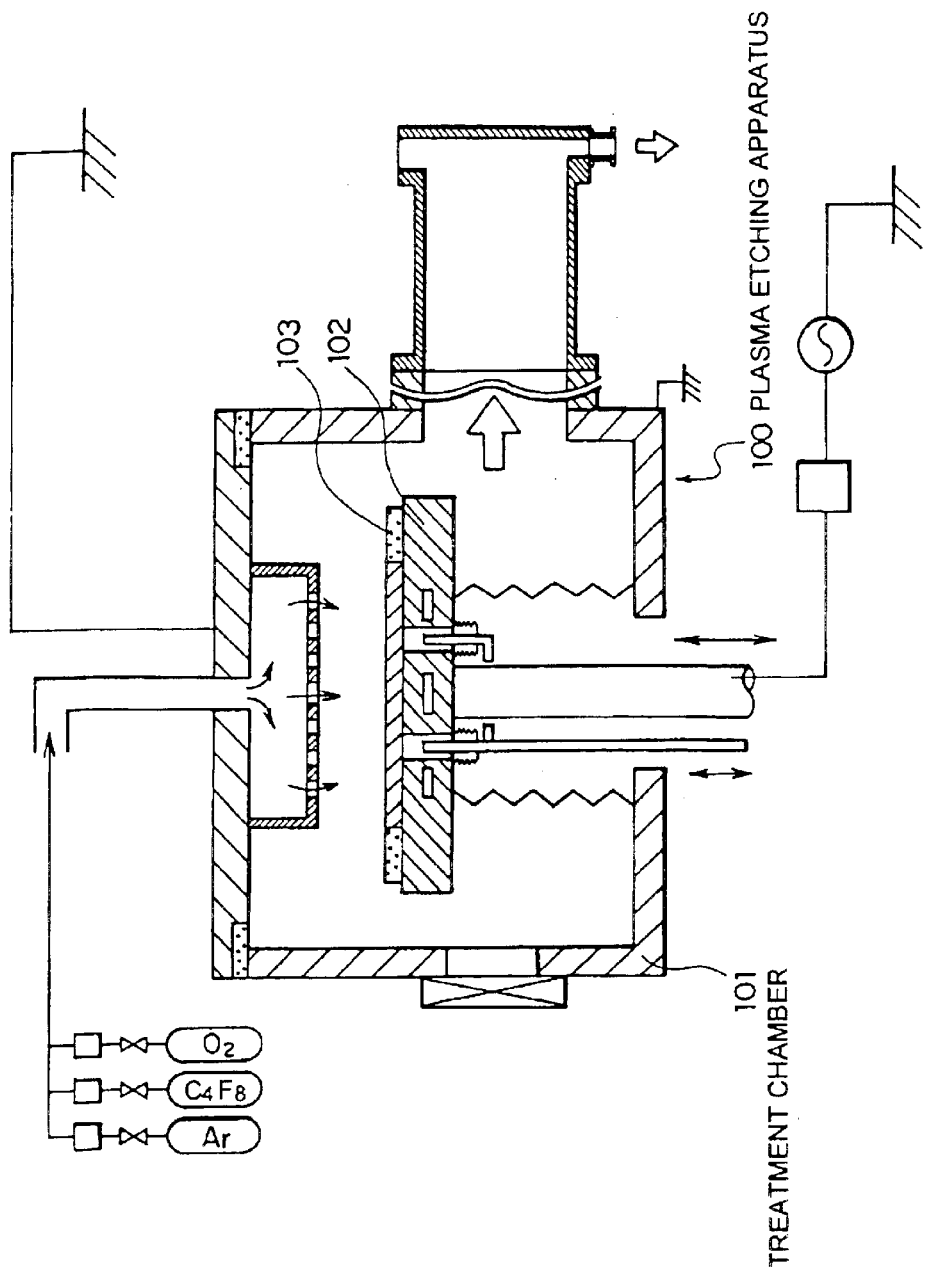
FIG. 14 is a vertical sectional view of existing apparatus for plasma etching.
Figure 15:
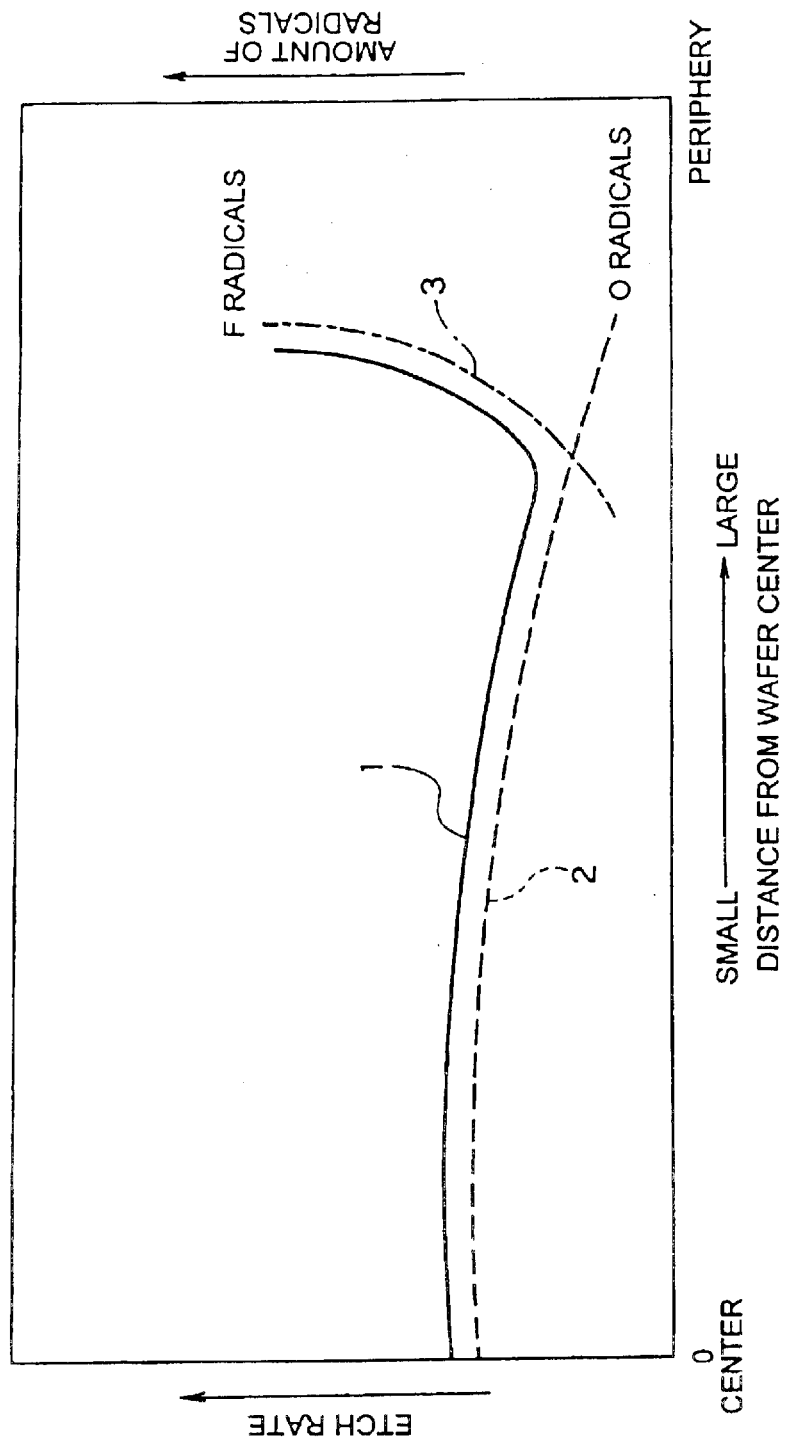
FIG. 15 is a graph showing the relationship between etch rate of resist film and distance from a wafer center when existing apparatus for plasma etching is used.

In the present embodiment, a compensation ring 31A with a structure as shown in FIG. 13 is employed.

In the compensation ring 31A, a disc like first compensation ring member 32A rectangular in section is engaged with an annular second compensation ring member 33A having an approximately rectangular section with a notch. The second compensation ring member 33A is disposed on the upper surface of the susceptor 30 through the layer of silicone rubber 34. On the other hand, the first compensation ring member 32A is only disposed on the notch portion on the inside periphery side of the second compensation ring member 33A.

In the compensation ring 31A involving the present embodiment, the first and second compensation ring members 32A and 33A are configured in simple shape, accordingly these can be manufactured with ease and at low cost.

According to the present apparatus for plasma treatment, the ring disposed in the surroundings of the substrate to treat is separated into the first and second ring members. During the treatment, the first ring member is maintained at first temperature on one hand, the second ring member being maintained at a second temperature on the other hand. Accordingly, successive treatment of a plurality of substrates to treat causes less variation of quality between the treated substrates, and uniform treatment can be given over an entire substrate to treat.

Furthermore, according to the present method for plasma treatment, along the periphery of the wafer a first temperature zone is annularly formed, outside of the first temperature zone a second temperature zone being formed. Under the conditions, the plasma treatment is applied onto the wafers. Accordingly, successive treatment of a plurality of substrates to treat causes less variation of quality between the treated substrates and uniform treatment over an entire substrate to treat.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A method for plasma treating a substrate, comprising:

forming, by a first ring member, an annular first temperature zone outside of the periphery of the substrate, and simultaneously performing a plasma treatment on the substrate in a state that a second temperature zone is formed outside of the annular first temperature zone by a second ring member which surrounds a periphery of the first ring member, wherein the annular first temperature zone is formed to scavenge a reactive product diffused from the second temperature zone.

2. The method for plasma treatment as set forth in claim 1 wherein the first temperature zone is a zone where the temperature thereof is higher than that of the second temperature zone.

3. The method for plasma treatment as set forth in claim 1 wherein the first temperature zone is formed with a width of one to three times mean free path of treatment gas molecules.

4. The method for plasma treatment as set forth in claim 1 wherein a width of the first temperature zone is in the range of 1 mm to 25 mm.

5. The method for plasma treatment as set forth in claim 1 wherein the plasma treatment is etching treatment.

6. The method for plasma treatment as set forth in claim 1 wherein the plasma treatment is an etching treatment using a gas including fluorine atoms.

7. The method for plasma treatment as set forth in claim 6 wherein the gas including the fluorine atoms is a gas of compound including fluorine atoms and carbon atoms.

8. A method for plasma treating a substrate on a susceptor, comprising:

forming, by a first ring member, an annular first temperature zone outside of the periphery of the substrate, and simultaneously performing a plasma treatment on the substrate in a state that a second temperature zone is formed outside of the annular first temperature zone by a second ring member wherein the second ring member surrounds a periphery of the first ring member and wherein between the second ring member and the susceptor a layer of thermally conductive material is interposed, the layer thermally conductive material is not in contact with the first ring member.

* * * * *